US012704570B2

(12) United States Patent
Leussler et al.

(10) Patent No.: US 12,704,570 B2
(45) Date of Patent: Aug. 11, 2026

(54) RADIO FREQUENCY (RF) ASSEMBLY WITH PLANAR RESONATOR

(71) Applicant: KONINKLIJKE PHILIPS N.V., Eindhoven (NL)

(72) Inventors: Christoph Günther Leussler, Hamburg (DE); Christian Findeklee, Norderstadt (DE); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 149 days.

(21) Appl. No.: 18/850,102

(22) PCT Filed: Mar. 21, 2023

(86) PCT No.: PCT/EP2023/057111

§ 371 (c)(1),
(2) Date: Sep. 24, 2024

(87) PCT Pub. No.: WO2023/186611

PCT Pub. Date: Oct. 5, 2023

(65) Prior Publication Data

US 2025/0208243 A1 Jun. 26, 2025

(30) Foreign Application Priority Data

Mar. 29, 2022 (EP) .................................... 22164922

(51) Int. Cl.
*G01R 33/36* (2006.01)

(52) U.S. Cl.
CPC ................................ *G01R 33/3614* (2013.01)

(58) Field of Classification Search
CPC ............ G01R 33/3614; G01R 33/3621; G01R 33/3685
See application file for complete search history.

(56) References Cited

U.S. PATENT DOCUMENTS

2007/0262777 A1 11/2007 Warntjes et al.
2008/0191699 A1 8/2008 Gauss et al.
(Continued)

FOREIGN PATENT DOCUMENTS

CN 113093075 A 7/2021

OTHER PUBLICATIONS

International Search Report and Written Opinion from PCT/EP2023/057111 mailed Jun. 12, 2023.
(Continued)

*Primary Examiner* — G.M. A Hyder

(57) ABSTRACT

In a radio frequency (RF) assembly for a magnetic resonance examination system, the RF assembly comprises: at least one receiver coil, for receiving MR signals from a patient, at least one low-noise amplifier (LNA), connected to the receiver coil for amplifying the MR signals, at least one low-voltage differential signal (LVDS) connection, wherein the LVDS connection is configured to transmit the received MR signals and to apply electrical power to the LNA, wherein the LVDS connection is formed as a LVDS digital cable (1). A solution for B1 transparency of the coil array, which reduces solder connections and RF plugs is to be achieved. This is achieved by at least one planar resonator (2), wherein the planar resonator (2) is inductively coupled to the LVDS digital cable (1) configured to act as an RF trap (10) for blocking spurious signals on the LVDS digital cable (1).

14 Claims, 3 Drawing Sheets

(56) References Cited

U.S. PATENT DOCUMENTS

| | | | | |
|---|---|---|---|---|
| 2009/0121717 | A1 * | 5/2009 | Haans ................ | G01R 33/3621<br>324/318 |
| 2021/0063514 | A1 | 3/2021 | Liu et al. | |
| 2021/0247475 | A1 | 8/2021 | Taracila et al. | |

OTHER PUBLICATIONS

A. Dianat et al "PCB Fabricated Passive RF Balun for 3 T MRI Applications", IEEE (CCECE) 2019.
http://www.circuits.dk/calculator_planar_coil_inductor.htm 2010.
Anil Pandey "RF Microwave and Antenna Designs" https://anilkrpandey.wordpress.com/2020/01/17/antenna-design-with-machine-learning/.
N. T. Tokan and F. Gunes, "Support vector design of the microstrip antenna," 2008 IEEE 16th Signal Processing, Communication and Applications Conference, pp. 1-4, Aydin, 2008.
H. El Misilmani et al "Machine Learning in Antenna Design: An Overview on Machine Learning Concept and Algorithms" IEEE 2019.

* cited by examiner

RADIO FREQUENCY (RF) ASSEMBLY WITH PLANAR RESONATOR

CROSS REFERENCE TO RELATED APPLICATIONS

This application is a U.S. national phase application of International Application No. PCT/EP2023/057111 filed on Mar. 21, 2023, which claims the benefit of EP Application Ser. No. 22/164,922.1 filed on Mar. 29, 2022 and is incorporated herein by reference.

FIELD OF THE INVENTION

The invention relates to the field of radio frequency (RF) assemblies for magnetic resonance examination systems, and in particular to an RF assembly with a planar resonator inductively coupled to a low-voltage differential signal (LVDS) digital cable.

BACKGROUND OF THE INVENTION

In magnetic resonance imaging, a strong uniform static magnetic field $B_0$ is generated, often by a superconducting magnet. The static magnetic field $B_0$ polarizes the nuclear magnetic spin system of an object to be imaged. A solenoid superconducting magnet generates the static magnetic field, $B_0$, along its own longitudinal axis and the common longitudinal axis of the cylindrical bore of the vacuum vessel, commonly denoted as the z-axis. Alternately, the $B_0$ field is generated in an open region between a pair of poles.

To generate a magnetic resonance signal, the polarized spin system is first excited by applying a magnetic resonance excitation signal or radio frequency magnetic field $B_1$, perpendicular to the z-axis. This RF field $B_1$ is typically produced by an RF coil located inside the bore of a bore-type magnet or adjacent the pole of an open magnet and closely conforming thereto to maximize the space available to receive a patient. The RF magnetic field is turned on and off to create short RF pulses to excite and manipulate magnetization in the polarized object in the bore. More specifically, the RF excitation pulses tip the magnetization out of alignment with the z-axis and cause its macroscopic magnetic moment vector to precess around the z-axis. The precessing magnetic moment, in turn, generates a radio frequency magnetic resonance signal. Additional RF pulses are commonly applied to manipulate the resonance to form enhanced signal strength RF echoes which are received by the same RF coil, or a local RF coil positioned near a region of interest.

Radio frequency coils are generally connected to the RF transmitter and/or the RF receiver of the magnetic resonance system using coaxial cable. Coaxial cable is designed to protect the system from picking up extraneous RF signals which are present in the environment. Coaxial cables feature a surrounding shield or ground conductor separated from a current carrying central conductor by a dielectric material. The surrounding ground conductor acts as a shield that minimizes the pick-up of foreign frequencies by the central conductor of the cable.

Despite the use of coaxial cables, there are still coupling problems at resonance frequencies, such as 63 MHz for hydrogen dipoles in a 1.5 T $B_0$ field. Among other things, the shield conductor of the coaxial cable itself tends to carry foreign induced currents, such as from TV transmissions, stray harmonics from the gradient pulse oscillators and clocking circuits in nearby equipment, and the like. The induced current is often referred to as "skin current" because it flows on the outside of the shield conductor. The stray RF current tends to flow out of the bore and into other circuits, such as the amplifiers, analog-to-digital converters, receivers, and reconstruction processor to contribute errors in the resultant image.

Traditionally, magnetic resonance imaging (MRI) has always relied on a wired connection between the receiver coil array and the external processing circuitry to generate accurate images. To attain high image quality, the number of receiver coil elements is increasing, and separate receiver coil arrays are used for different parts of the body, resulting in increased cabling complexity.

Digital MRI coils will be based on (Po)LVDS ((Power over) Low-voltage differential signaling), which can run at very high data rates using inexpensive twisted-pair copper cables. In a digital coil array, the feeding cable network needs to be electrically trapped to provide low impact on the $B_1$ transmit signal. During reception a high isolation is required to keep spurious signals from the digital data transmission and received by the MRI coil as low as possible (i.e., significantly below thermal noise level at the LNA input, thus <174 dBm/Hz)). Due to the close proximity of the digital signal flow to the antenna coil elements, any openings or asymmetry on PCB layout needs to be omitted, combined with symmetric cable routing to reduce capacitive and inductive electromagnetic coupling.

US 2009/0121717 A1 discloses a radio frequency antenna comprising a resonant pickup circuit arranged to pick up a magnetic resonance signal, an analog-to-digital converter arranged to convert the magnetic resonance signal to digital data, and a frequency converter arranged to convert a primary band of frequencies of the digital data. By upshifting the frequency of the transmitted bit-stream, it is possible to RF-trap the transmission channel by simple high-pass filtering techniques.

US 2021/247475 A1 discloses various methods and systems for a flexible, lightweight, and low-cost radio frequency (RF) trap for use in a magnetic resonance imaging (MRI) system. In one example, a radio frequency (RF) trap assembly for use in a magnetic resonance imaging (MRI) system is provided, comprising a twinax wire assembly having a plurality of looped portions, each ones of the plurality of looped portions tangentially in contact with a shielded cable, and at least one support structure for substantially maintaining the shape of the plurality of looped portions, the support structure surrounding a portion of the shielded cable, wherein the twinax wire assembly is tuned to a frequency suitable for increasing the impedance of the shielded cable.

EMC shielding is one on the big challenges for the integration of the digital signal path. The differential signal transmission needs to be electrically fully balanced and any solder- or plug connection needs to be omitted. Inadequate shielding of digital twinax LVDS cables by cutting and soldering leads to spurious signals that cause distortion (in k-space) of MR images. Furthermore, toroidal LVDS traps need high number of windings and an electromagnetic isolation. Unbalanced PCB connections produce RF leakage. Common mode chokes for LVDS provide a poor digital noise suppression for MRI.

SUMMARY OF THE INVENTION

It is an object of the invention to provide an RF trap for a radio frequency (RF) assembly for a magnetic resonance examination system to block spurious signals.

According to the invention, this object is addressed by the subject matter of the independent claims. Preferred embodiments of the invention are described in the dependent claims.

Therefore, according to the invention, a radio frequency (RF) assembly for a magnetic resonance examination system is foreseen, the RF assembly comprising: at least one receiver coil, for receiving MR signals from a patient, at least one low-noise amplifier (LNA), connected to the receiver coil for amplifying the MR signals, at least one analog-to-digital converter for converting analog MR signals to digital MR signals, at least one low-voltage differential signal (LVDS) connection, wherein the LVDS connection is configured to transmit the digital MR signals and to apply electrical power to the LNA, wherein the LVDS connection is formed as a LVDS digital cable, at least one planar resonator, wherein the planar resonator is inductively coupled to the LVDS digital cable configured to act as an RF trap for blocking spurious signals on the LVDS digital cable.

A defined winding patterns and a high number of windings is required to achieve self-resonance for toroidal LVDS trapping. The basic idea of the present invention is to propose a planar resonator design, which is inductively coupled to the LVDS feeding digital cable. The invention increases the stray capacitance between the windings, reduces the self-inductivity and coupling to the close environment (body coil/patient) and the number of windings, however, still providing a high impedance at the MRI frequency. The design reduces the number of extra local traps. The proposed high impedance design can be made more flexible and production cost are reduced. Due to the shielding, radiation noise of unbalanced differential digital signal transmission is suppressed with high efficiency.

In an advantageous embodiment of the invention the LVDS digital cable comprises at least one inductive coupling loop, wherein the inductive coupling loop is positioned in the vicinity of the planar resonator such that there is a coupling of magnetic flux through both the planar resonator and the inductive coupling loop of the LVDS digital cable for the inductive coupling. To provide inductive coupling between the planar resonator and the LVDS digital cable is advantageous if the LVDS digital cable comprises at least one inductive coupling loop.

In another advantageous embodiment of the invention the planar resonator is separated from the inductive coupling loop of the LVDS digital cable by an isolating layer.

In an advantageous embodiment of the invention the LVDS digital cable is arranged and fixed in a mechanical housing. That the LVDS digital cable is fixed in the mechanical housing has the advantage that no soldering is required, which allows to guarantee, that the shield is not interrupted, and high EMC isolation is achieved.

In another advantageous embodiment of the invention the mechanical housing comprises at least one recess for the inductive coupling loop of the LVDS digital cable. The cable is routed in the recess. The mechanical dimension allows to directly fixate the cable including strain relief.

In an advantageous embodiment the mechanical housing is made of a material, wherein the electromagnetic properties of the material and/or the thickness of the material are arranged in such a way to support a tuning of a self-resonance of the planar resonator and/or an electromagnetic coupling between the LVDS digital cable and the planar resonator. Next to the mechanical functions of the mechanical housing, electromagnetic properties of the material and the thickness of the material are tailored to support/enable the tuning of the self resonance of planar resonator and/or the electromagnetic coupling between LVDS digital cable and the planar resonator. Also, it may be envisaged that the electromagnetic properties of the material of the mechanical housing can be tuned when metamaterials are used. For example, certain ceramic materials can be selected with a tailored dielectric constant $\varepsilon_r$ and low losses for this purpose.

In an advantageous embodiment of the invention the RF assembly comprises a plurality of planar resonators, wherein the planar resonators are in a stack or arranged in a plane or stacks of planes. Stacks of planar resonators allow a higher parameter space for an electromagnetic design of the LVDS trap.

In another advantageous embodiment of the invention the planar resonator comprises a shielded self-resonant spiral resonator or a structured metamaterial-based resonator. Different types of resonators can be used. These are, for example, spiral resonators or resonators made of a metamaterial. A metamaterial is a material engineered to have a property that is not found in naturally occurring materials. They are made from assemblies of multiple elements fashioned from composite materials such as metals and plastics. The materials are usually arranged in repeating patterns, at scales that are smaller than the wavelengths of the phenomena they influence. Metamaterials derive their properties not from the properties of the base materials, but from their newly designed structures. Their precise shape, geometry, size, orientation and arrangement gives them their smart properties capable of manipulating electromagnetic waves: by blocking, absorbing, enhancing, or bending waves, to achieve benefits that go beyond what is possible with conventional materials.

In an advantageous embodiment of the invention the planar resonator inductively coupled to the LVDS digital cable is integrated in the low-noise amplifier (LNA) or is placed along the low-voltage differential signal (LVDS) connection.

In another advantageous embodiment of the invention the low-noise amplifier (LNA) is a digital preamplifier.

The invention further relates to a magnetic resonance (MR) examination system, the MR examination system comprising a radio frequency (RF) assembly as described above.

The invention also relates to a computer-implemented method for optimizing parameters of the radio frequency (RF) trap comprising the planar resonator as described above. The method includes receiving an input dataset comprising dielectric parameters of a material of the planar resonator, calculating, using a trained machine learning model, design parameters of the RF trap comprising the planar resonator, wherein the design parameters are calculated to optimize a characteristic of the RF trap. The design parameters comprise geometrical parameters of the planar resonator, and/or geometrical parameters of the LVDS digital cable. The method further includes producing an output dataset comprising the optimized design parameters.

The characteristic of the RF trap may include e.g. common mode suppression/attenuation, differential mode suppression/attenuation, signal to noise ratio, bandwidth of suppression/attenuation, local RF heating, weight, size, footprint cost, eddy currents, etc. In particular, an important aspect of the optimized RF trap may be the reduction of the common mode current. The common mode suppression of the traps may be highly influential for the image quality of a coil array. Insufficient isolation can lead to noise coupling between the individual antenna elements. The input dataset may optionally also include other boundary conditions and/or fixed parameters of the RF trap. The input may include ranges of parameters or characteristics, such as but not limited to a range of acceptable signal to noise ratios, sizes etc. Dielectric parameters may include permittivity and/or permeability of the material of the planar resonator. Geometrical parameters of the planar resonator may include e.g. shape, windings, thickness, width, length etc. Geometrical parameters of the LVDS cable may include e.g. diameter, length, windings of the inductive coupling loop etc. Hence, the invention also relates to a machine-learning model for optimizing parameters of the RF trap according as described above, in particular for use in the method as described above.

The invention also relates to a computer-implemented method of training a machine-learning model, such as preferably the machine learning model to calculate design parameters to optimize a characteristic of the RF trap as described above. The method of training the machine-learning model comprises: receiving an input dataset comprising dielectric parameters of a material of the planar resonator and characteristics of the RF trap, wherein the input dataset further comprises geometrical parameters of the planar resonator and/or geometrical parameters of the LVDS digital cable; and training a machine learning algorithm of the machine-learning model using the input dataset. The input dataset for training the machine learning model may comprise simulated data. E.g. but not limited to simulated characteristics of the RF trap. With the growth and wide variety of available data, advanced processing, and affordable data storage, machine learning is witnessing great attention in finding optimized solutions in various fields. Machine learning techniques are currently taking a major part of the ongoing research and expected to be the key player in today's technologies. Machine learning provides an accelerated MRI antenna and RF trap design process while maintaining high accuracy levels.

The invention also relates to a data processing apparatus comprising a processor for carrying out the method as described above.

The invention also relates to a computer program comprising instructions which, when the program is executed by a computer, cause the computer to carry out the method as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
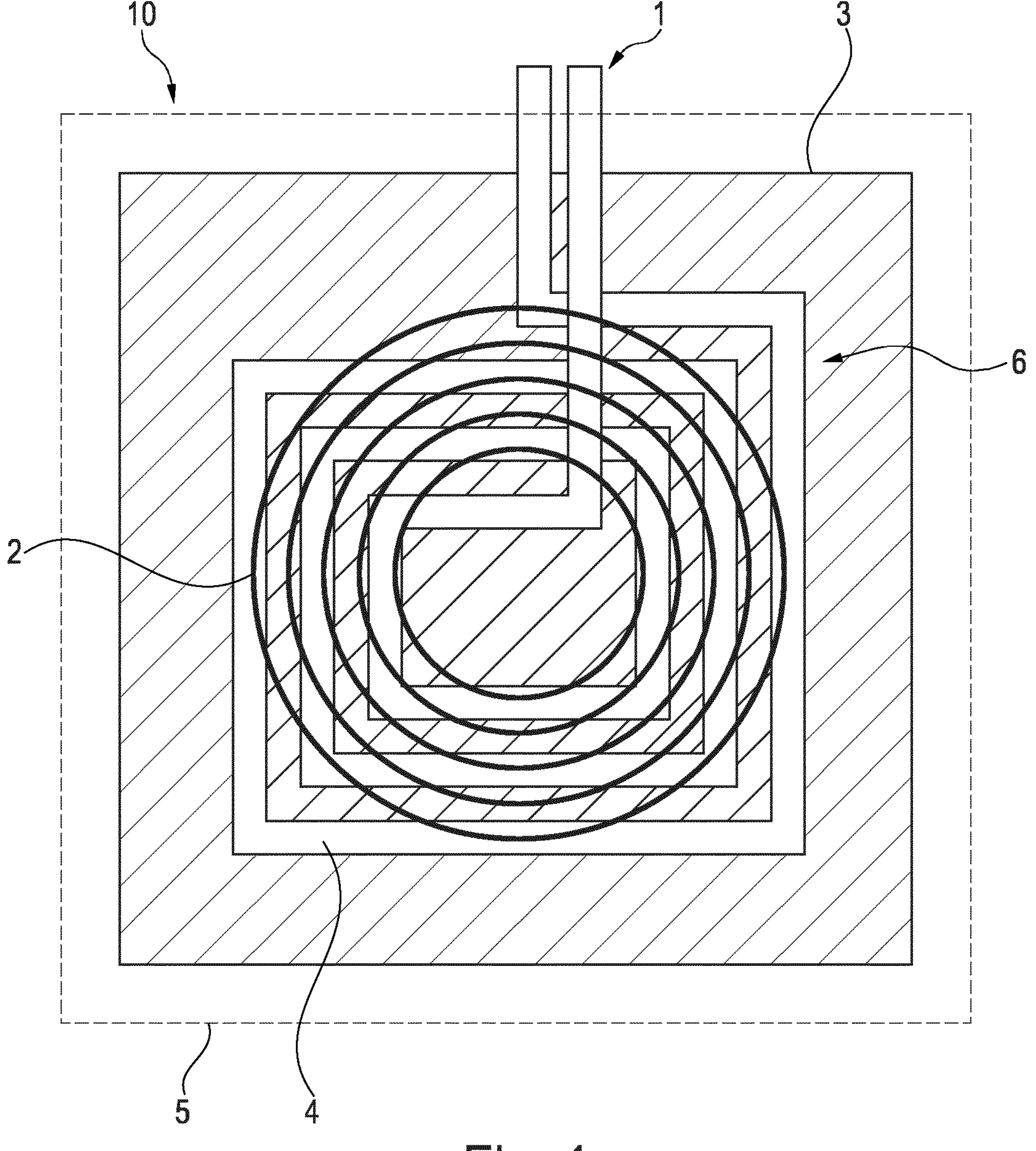
FIG. 1 schematically depicts a top view of a layout of a planar LVDS trap according to an embodiment of the invention, FIG. 2 schematically depicts different side views of layouts of planar LVDS traps according to different embodiments of the invention, FIG. 3 schematically depicts different planar resonator layouts according to different embodiments of the invention, FIG. 4 schematically depicts different geometrical designs of inductive coupling loop of the LVDS digital cable according to different embodiments of the invention.

FIG. 1 schematically depicts a top view of a layout of a planar LVDS trap 10 according to an embodiment of the invention. Basically, a radio frequency (RF) assembly for a magnetic resonance examination system comprises a receiver coil for receiving MR signals from a patient. The MR signals are amplified by a low-noise amplifier (LNA) connected to the receiver coil. An analog-to-digital converter may convert analog MR signals to digital MR signals. It is further provided that the assembly comprises at least one low-voltage differential signal (LVDS) connection for transmitting the digital MR signals and for to applying electrical power to the LNA. In an embodiment of the invention, the LVDS connection is formed as a LVDS digital cable 1 that includes twisted conductor pairs or a twin-ax (or multi-ax) conductor. Furthermore, the assembly comprises at least one planar resonator 2, wherein the planar resonator 2 is inductively coupled to the LVDS digital cable 1 configured to act as planar LVDS trap 10 for blocking spurious signals on the LVDS digital cable 1. The planar resonator 2 may be a self-resonant resonator arranged in concentric circles as shown in FIG. 1 or a structured metamaterial-based resonator. The inductive coupling is achieved in that the LVDS digital cable 1 is arranged in loops 4 that are positioned in the vicinity of the planar resonator 2 such that there is an appreciable coupling of magnetic flux through both the plane resonator 2 and the loops 4 of the LVDS digital cable 1. The LVDS digital cable 1 is fixed in a mechanical housing 3 which has a recess 6 for the LVDS digital cable winding so that no soldering connection is needed. The planar resonator 2 is built such that it is self-resonant, and no external capacitor is needed. The mechanical dimension allows to directly fixate the cable 1 including a strain relief, so that the inductive coupling is kept constant. In an embodiment next to the mechanical functions of the mechanical housing 3, electromagnetic properties of the material of the mechanical housing 3 and the thickness of the material are tailored to support or enable the tuning of the self resonance of the planar resonator 2 and/or the electromagnetic coupling between the LVDS digital cable 1 and the planar resonator 2. Also, it may be envisaged that the electromagnetic properties of the material of the mechanical housing can be tuned when metamaterials are used. For example, certain ceramic materials can be selected with a tailored dielectric constant $\varepsilon_r$ and low losses for this purpose. In an embodiment the design of the inductive coupling loops 4 of the LVDS digital cable or the design of planar resonator 2 e.g., number of windings in a spiral, the area etc. is matched with the dielectric constant $\varepsilon_r$ of the material of the mechanical housing 3. In an embodiment the planar resonator 2 is realized as shown in FIG. 1 as with spiral (square) windings forming the conductive loop 4. On top of the conductive loop 4, the windings of the LVDS cable 1 are placed. In an embodiment the windings are enclosed e.g., by two square 25 mm×25 mm copper foils, leading to a total height of the stack of e.g., 5 mm. An isolating layer e.g., a plastic layer, can be provided between the conductive loops and the windings of the LVDS cable. The isolating layer is not shown in FIG. 1 for clarity but is shown in FIG. 2.

Figure 2:
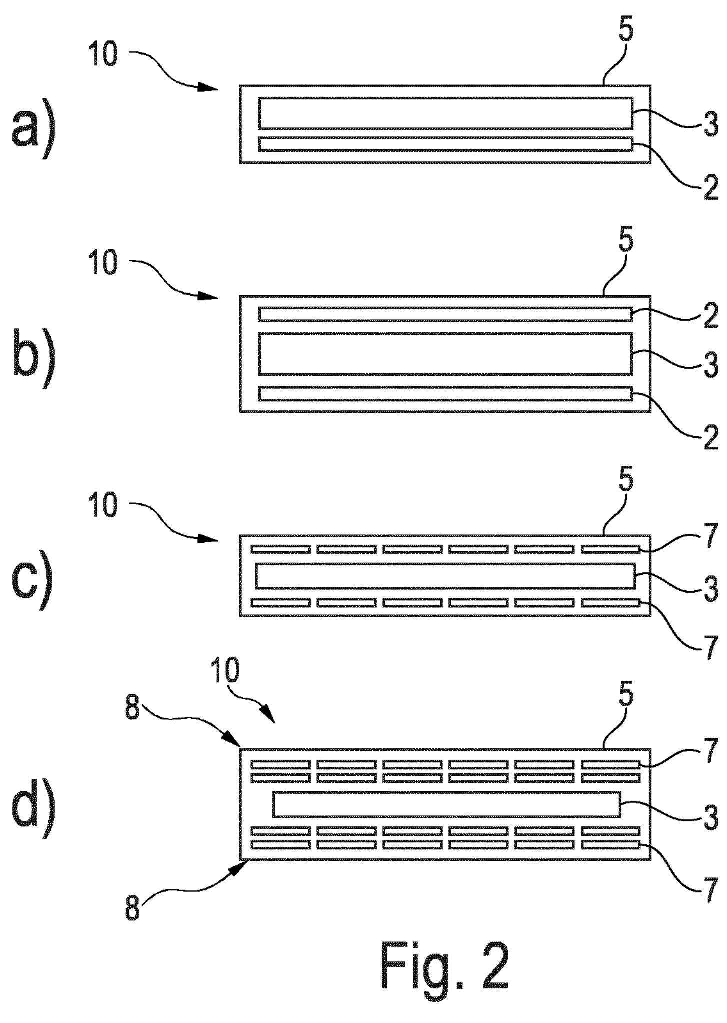

FIG. 2 schematically depicts different side views of layouts of planar LVDS traps 10 according to different embodiments of the invention. FIG. 2 *a*) shows a side view of a LVDS trap 10 with a mechanical housing 3 and one planar resonator 2. Inside the mechanical housing 3 the LVDS digital cable 1 is arranged in loops forming an inductive coupling loop 4. Between the planar resonator 2 and the inductive coupling loop 4 of the LVDS digital cable 1 an isolating layer can be foreseen. The LVDS cable 1 can e.g., comprise twisted conductor pairs or multi-ax conductors. FIG. 2 *b*) shows another embodiment of the invention. In FIG. 2 *b*) a centered inductive housing 3 with symmetrically placed resonators 2 is shown. The resonators 2 are inductively coupled and provide a broader resonance, wherein the coupling coefficient (k) depends on the distance of the resonators and the distance to the RF shield 5.

In FIG. 2 *c*) an embodiment of the invention in which the resonators 2 consist of structured metamaterial 7 is shown. In FIG. 2 *c*) it is shown that several resonant structures 7 are electromagnetically coupled to each other, which allows to design a broader resonance spectrum of the trap 10.

In another embodiment of the invention the structured metamaterial-based resonators 7 are arranged in stacks 8 which is shown in FIG. 2 *d*) allowing a higher parameter space for the electromagnetic design. The resonance spectrum is calculated using an EM program.

Figure 3:
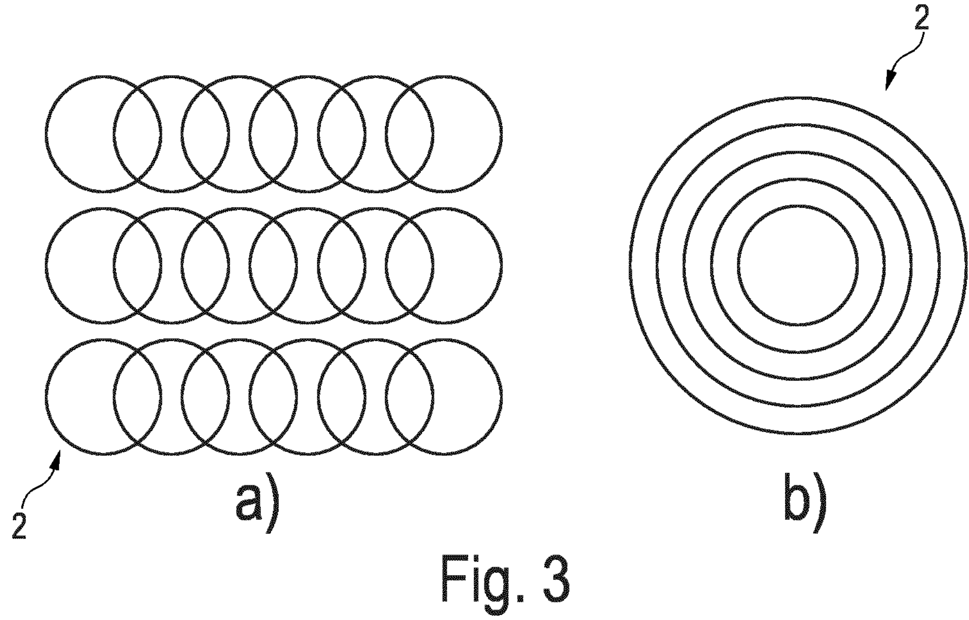

FIG. 3 schematically depicts different planar resonator layouts according to different embodiments of the invention. For example, the planar resonators 2 can be arranged as overlapping circles, which is shown in FIG. 3 *a*). In another embodiment, the resonators can be arranged in concentric circles, which is shown in FIG. 3 *b*). The individual resonators 2 are self-resonant in combination with the RF shielding 5 and the permittivity of the base material. Shape and dimension of the planar resonator 2 as well as diameter and number of windings the inductive coupling loop 4 of the LVDS digital cable 1 determine the kind of coupling and with it, the features of the RF trap 10, like maximum common mode suppression, bandwidth of suppression and potential local RF heating.

The optimization procedure as described later may include parameters of the stray field caused by the coupled resonators and the coiled LVDS cable so that in an embodiment of the invention an RF shield is not required. The planar resonators 2 shown in FIG. 3 can be based on a metamaterial.

Figure 4:
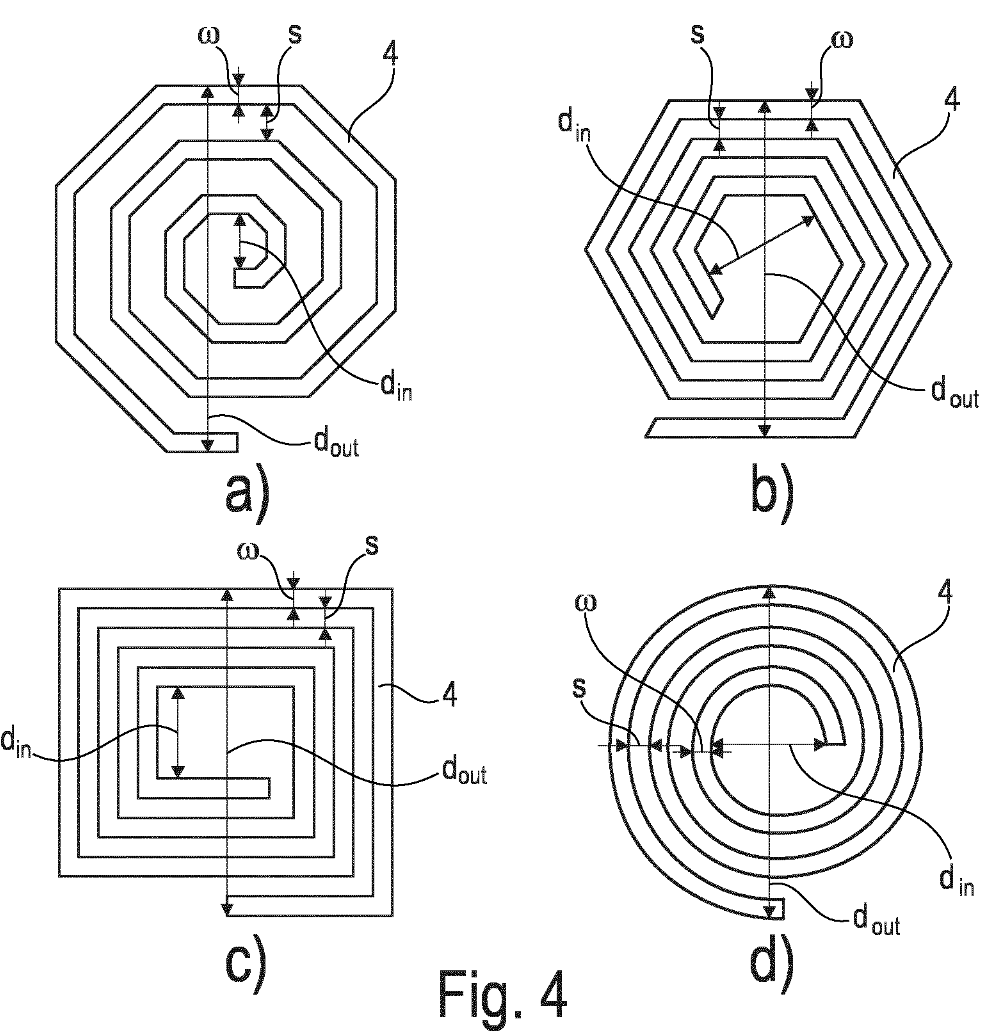

FIG. 4 *a*) to *d*) shows the layout for a square, hexagonal, octagonal, and circular inductive coupling loops 4 of the LVDS digital cable 1, respectively. For a given shape, an inductor is completely specified by the number of turns n, the turn width ω, the turn spacing s, and any one of the following: the outer diameter $d_{out}$, the inner diameter $d_{in}$, the average diameter $d_{avg}=0.5(d_{out}+d_{in})$, or the fill ratio, defined as $\rho=(d_{out}-d_{in})/(d_{out}+d_{in})$.

Figure 5:
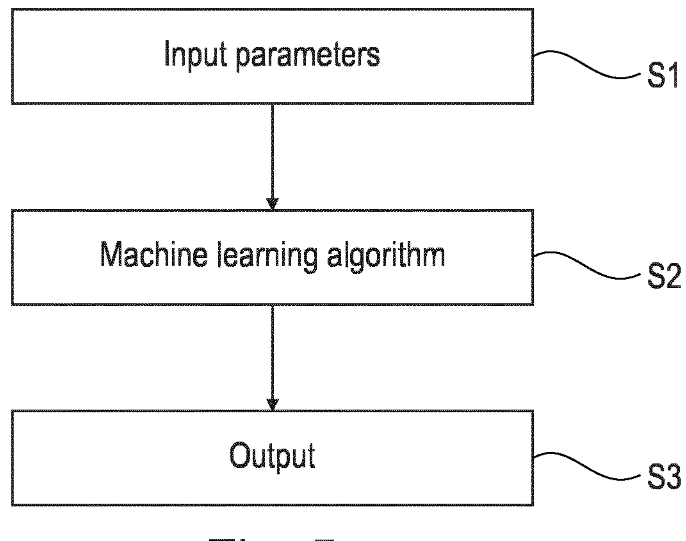
FIG. 5 shows a flowchart of a method for optimizing parameters of a planar resonator of a radio frequency (RF) assembly according to an embodiment of the invention.

FIG. 5 shows a flowchart of a method for optimizing parameters of an RF trap 10 comprising a planar resonator 2 of a radio frequency (RF) assembly according to an embodiment of the invention. Broadband characteristics of the RF trap 10 can be achieved by using an artificial intelligence based electromagnetic simulation. In an embodiment of the invention a machine learning algorithm uses input parameters as permittivity, permeability and geometrical parameters of the inductive coupling loop 4 as classifiers for a relative broadband optimization. One approach of using machine learning in RF trap design is training a learning algorithm on data collected from previous simulations to optimize the RF trap parameters. For example, the parameterized resonator design can be used as input parameters for a neuronal network approach as training parameters as well as data collected from previous simulations. Other approaches use e.g., Support Vector Machines (SVMs) or Artificial Neural Networks (ANNs). In general, in order to apply machine learning in an RF trap design process, the following steps can be done: The electromagnetic characteristics of an RF trap 10 are found out by multiple simulations. These characteristics are stored in a database and used as a data set for training a certain machine learning algorithm. The RF trap that gives the closest results is designed by the algorithm after making predictions, depending on the needs of the designer.

The method for optimizing parameters of a planar resonator 2 of a radio frequency (RF) assembly includes for example the following steps. Receiving an input dataset comprising dielectric parameters of a material of the planar resonator 2 and/or geometrical parameters of the planar resonator 2 as input for the machine-learning model in a first step S1. In step S2 optimized design parameters of RF trap 10 comprising the planar resonator 2 are calculated using the machine learning model. In a third step S3 an output dataset is produced. The output dataset may comprise an optimized scatter matrix $S_{nm}$ of scatter parameters. Scatter parameters may include internal connections, reflection and/or transmission of the digital symmetric signal etc. Optimized parameters may be used to realize an RF trap with suppression of common mode signal and with attenuation of differential signal. In particular, the approach can be used to calculate the RF trap 10 with a structured metamaterial, by a pre-processor using artificial intelligence. To create a relation between the performance of the RF trap design and its isolation property, a machine learning algorithm is trained using dielectric parameters (permittivity) of the composite material (PCB) as well as geometrical parameters of the structured planar metamaterial-based resonators 7 as input.

The method to optimize characteristics of the RF trap 10 may include receiving S1 an input dataset comprising dielectric parameters of a material of the planar resonator, calculating S2, using a trained machine learning model, design parameters of the RF trap 10 comprising the planar resonator 2, wherein the design parameters are calculated to optimize a characteristic of the RF trap 10. The design parameters comprise geometrical parameters of the planar resonator 2 inductively coupled to the LVDS digital cable 1, and/or geometrical parameters of the LVDS digital cable 1. The method further includes producing an output S3 dataset comprising the optimized design parameters.

The characteristic of the RF trap 10 may include e.g. common mode suppression/attenuation, differential mode suppression/attenuation, signal to noise ratio, bandwidth of suppression/attenuation, local RF heating, weight, size, footprint cost, eddy currents, etc. In particular, an important aspect of the optimized RF trap 10 may be the reduction of the common mode current. The input dataset may optionally also include other boundary conditions and/or fixed parameters of the RF trap. The input may include ranges of parameters or characteristics, such as but not limited to a range of acceptable signal to noise ratios, sizes etc. Dielectric parameters may include permittivity and/or permeability of the material of the planar resonator. Geometrical parameters of the planar resonator may include e.g. shape, windings, thickness, width, length, etc. Geometrical parameters of the LVDS cable may include e.g. diameter, length, windings of the inductive coupling loop 4, etc.

A computer-implemented method of training the machine-learning model may include receiving an input dataset comprising dielectric parameters of a material of the planar resonator 2 and characteristics of the RF trap 10 comprising the planar resonator 2 and the digital LVDS cable 1. The input dataset may include geometrical parameters of the planar resonator 2 and/or geometrical parameters of the LVDS digital cable 1. The method includes training a machine learning algorithm of the machine-learning model using the input dataset.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST low-voltage differential signal (LVDS) digital cable 1
planar resonator 2
mechanical housing 3
inductive coupling loop 4
RF shielding 5
recess 6
planar metamaterial-based resonator 7
stacks of planar metamaterial resonators 8
RF trap 10
turn width ω
turn spacing S
inner diameter $d_{in}$
outer diameter $d_{out}$

The invention claimed is:

1. A radio frequency (RF) assembly for a magnetic resonance examination system, the RF assembly comprising:

at least one receiver coil configured to receive magnetic resonance (MR) signals from a patient, at least one low-noise amplifier (LNA), connected to the receiver coil, the LNA configured to amplify the MR signals, at least one analog-to-digital converter configured to convert analog MR signals to digital MR signals, at least one low-voltage differential signal (LVDS) connection that is configured to transmit the digital MR signals and to apply electrical power to the LNA, wherein the LVDS connection is formed as a LVDS digital cable, at least one planar resonator that is inductively coupled to the LVDS digital cable and configured to act as an RF trap for blocking spurious signals on the LVDS digital cable.

2. The radio frequency assembly according to claim 1, wherein the LVDS digital cable comprises at least one inductive coupling loop, wherein the inductive coupling loop is positioned in the vicinity of the planar resonator such that there is a coupling of magnetic flux through both the planar resonator and the inductive coupling loop of the LVDS digital cable for the inductive coupling.

3. The radio frequency assembly according to claim 2, wherein the planar resonator is separated from the inductive coupling loop of the LVDS digital cable by an isolating layer.

4. The radio frequency assembly according to claim 1, wherein the LVDS digital cable is arranged and fixed in a mechanical housing.

5. The radio frequency assembly according to claim 4, wherein the mechanical housing comprises at least one recess for the inductive coupling loop of the LVDS digital cable.

6. The radio frequency assembly according to claim 4, wherein the mechanical housing (3) is made of a material, wherein the electromagnetic properties of the material and/or the thickness of the material are arranged in such a way to support a tuning of a self-resonance of the planar resonator and/or an electromagnetic coupling between the LVDS digital cable and the planar resonator.

7. The radio frequency assembly according to claim 1, wherein the RF assembly comprises a plurality of planar resonators, wherein the planar resonators are in a stack or arranged in a plane or stacks of planes.

8. The radio frequency assembly according to claim 1, wherein the planar resonator comprises a shielded self-resonant spiral resonator or a structured metamaterial-based resonator.

9. The radio frequency assembly according to claim 1, wherein the planar resonator inductively coupled to the LVDS digital cable is integrated in the low-noise amplifier or is placed along the low-voltage differential signal connection.

10. The radio frequency assembly according to claim 1, wherein the low-noise amplifier is a digital preamplifier.

11. A magnetic resonance examination system, the MR examination system comprising a radio frequency assembly according to claim 1.

12. A computer-implemented method for optimizing parameters of the RF trap comprising the planar resonator according to claim 1, the method comprising:

receiving an input dataset comprising dielectric parameters of a material of the planar resonator;

calculating, using a trained machine learning model, design parameters of the RF trap, wherein the design parameters are calculated to optimize a characteristic of the RF trap and comprise geometrical parameters of the planar resonator, and/or geometrical parameters of the LVDS digital cable; and producing an output dataset comprising the optimized design parameters.

13. A computer-implemented method of training a machine-learning model for optimizing a characteristic of the RF trap comprising the planar resonator according to claim 1, the method comprising:

receiving an input dataset comprising dielectric parameters of a material of the planar resonator and characteristics of the RF trap, wherein the input dataset further comprises geometrical parameters of the planar resonator and/or geometrical parameters of the LVDS digital cable; and training a machine learning algorithm of the machine-learning model using the input dataset.

14. A computer program comprising instructions stored on non-transitory computer readable medium which, when the program is executed by a computer, cause the computer to carry out the method of claim 12.

* * * * *